United States Patent
Cheng et al.

(10) Patent No.: US 6,853,205 B1
(45) Date of Patent: Feb. 8, 2005

(54) PROBE CARD ASSEMBLY

(75) Inventors: Shih-Jye Cheng, Hsinchu (CN); An-Hong Liu, Tainan (CN); Yeong-Her Wang, Tainan (TW); Yuan-Ping Tseng, Hsinchu (TW); Yao-Jung Lee, Tainan (CN)

(73) Assignees: Chipmos Technologies (Bermuda) Ltd., Hamilton (BM); Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 10/620,448

(22) Filed: Jul. 17, 2003

(51) Int. Cl.$^7$ ............................................. G01R 31/02
(52) U.S. Cl. ...................................... 324/754; 324/761
(58) Field of Search ............................... 324/754–755, 324/761–762, 765; 428/209–210; 439/482; 361/764, 733, 766; 174/251, 254, 256, 260

(56) References Cited

U.S. PATENT DOCUMENTS

| | | | | |
|---|---|---|---|---|
| 4,731,577 A | | 3/1988 | Logan | |
| 4,906,920 A | * | 3/1990 | Huff et al. | 324/754 |
| 5,148,103 A | * | 9/1992 | Pasiecznik, Jr. | 324/758 |
| 5,847,571 A | * | 12/1998 | Liu et al. | 324/754 |
| 5,973,504 A | * | 10/1999 | Chong | 324/754 |
| 6,204,674 B1 | * | 3/2001 | Dabrowiecki et al. | 324/754 |
| 6,330,744 B1 | * | 12/2001 | Doherty et al. | 324/757 |
| 6,578,264 B1 | * | 6/2003 | Gleason et al. | 324/754 |
| 6,624,648 B2 | * | 9/2003 | Eldridge et al. | 324/761 |

* cited by examiner

Primary Examiner—Kamand Cuneo
Assistant Examiner—Jermele Hollington
(74) Attorney, Agent, or Firm—Birch, Stewart, Kolasch & Birch, LLP

(57) ABSTRACT

A probe card assembly is disclosed. The probe card assembly comprises a stiffener ring combining respectively with an upper printed circuit board and a lower printed circuit board. A plurality of coaxial transmitters are installed in the stiffener ring, and connect to the upper and lower printed circuit boards by cable connectors. The lower printed circuit board is assembled with a detachable probe head which comprises a silicon substrate with probing points and a probe head carrier. A downset is formed at the center of the probe head carrier. The standardized coaxial transmitters, printed circuit boards and probe heads are then assembled as a probe card assembly for testing all sorts of IC products.

9 Claims, 3 Drawing Sheets

PROBE CARD ASSEMBLY

FIELD OF THE INVENTION

The present invention relates to a probe card for wafer testing and, more particularly, to a probe card assembly that is modularized and standardized.

BACKGROUND OF THE INVENTION

After semiconductor dices are fabricated on a wafer, they will need to go through chip probing or wafer sorting to verify their electrical performance. Usually, the toolings for testing semiconductor wafers are probe cards. A probe card is a tooling which should be manufactured before chip probing or wafer sorting. It is installed on the test head of a tester as an interface between a tester and a wafer under test. Conventionally, a vertical probe card comprises a multi-layer printed circuit board, mostly around 30 to 60 wiring layers, which is complex and costly. The multi-layer printed circuit board is further jointing with an even more costly multi-layer ceramic substrate as a probe head. On the multi-layer ceramic substrate, a plurality of probe needles are formed on an exposed surface for probing the electrode, such as pads or bumps, of semiconductor wafers. The vertical probe card is extremely expensive, and for different IC products, it needs to design the corresponding probe card to meet the special layout of bonding pads of wafer under test. Moreover, the components of a vertical probe card can not be reused.

A conventional probe card employing coaxial cables mainly comprises a substrate. The substrate has a front side and a back side, the front side formed with a large ground plane and a plurality of contact points. Wherein the layout of ground plane is to solder the outer shield of coaxial cables on the plane to provide grounding and shielding effects. The contact points on edges of the front side are for providing electrical connection to a tester. On the front side of the substrate, a plurality of outer connecting points are formed for soldering probe needles. The outer connecting points for soldering probe needles and the contact points on the front side are connecting to each other by means of a plurality of coaxial cables. Each of the coaxial cable is electrically connected individually, and can not be modularized. The circuit layers of the substrate can not be reduced, and can only be used for testing low-density electronic products. Furthermore, the substrate of a conventional probe card is a printed circuit board, which has different thermal coefficient from that of a wafer under test. This arises the problem that the probe card is not able to precisely position and contact the wafer while in electrical contact at certain temperatures.

In U.S. Pat. No. 4,731,577 entitled "COAXIAL PROBE CARD", a multipoint microwave coaxial probe card is disclosed. A printed circuit board has edge connectors and a mounting ring attached to the surface. The mounting ring has a plurality of via, and each is assembled with a microwave connector. These microwave connectors electrically connect to cantilever needles by coaxial cables. A portion of the cantilever needles are joined to the edge connector by conductive wires allowing both high and low frequency signals to be utilized simultaneously. Furthermore, a shield cover in the form of a flat plate encloses the mounting ring to provide RFI and EMI shielding and allows the coaxial probe card to test the microwave semiconductor wafers. However, this conventional coaxial probe card does not have a probe head, and therefore no cantilever needles can be integrated on it. The individual probe needles are manually installed on the coaxial cables. Furthermore, the coaxial probe card can not have the benefits of modularization to reduce manufacturing cost and lead time.

SUMMARY OF THE INVENTION

A main purpose of the present invention is to supply a probe card assembly, utilizing modularized components such as an upper and a lower printed circuit board, and a plurality of coaxial transmitters to replace the conventional complex multi-layer printed circuit board and multi-layer ceramic substrate. The upper printed circuit board is assembled with the lower printed circuit board by a stiffener ring which encloses coaxial transmitters. The lower printed circuit board is assembled with a detachable modularized probe head. Therefore, a probe card assembly with modularized and standardized components is manufactured.

A second purpose of the present invention is to supply a probe card assembly, utilizing an opening formed on the center of upper printed circuit board. When a probe card is assembled on the probe head, the opening will be sealed. When the probe card is disassembled, the coaxial transmitters can be installed, adjusted or repaired through the opening.

A third purpose of the present invention is to supply a probe card assembly, utilizing a detachable probe head to assemble with a lower printed circuit board. The probe head has a silicon substrate, a probe head carrier, and a flex printed circuit board extending from the surroundings of the probe head carrier to the lower printed circuit board.

The probe card assembly in accordance with the present invention comprises a stiffener ring. An upper printed circuit board is installed on an upper opening of the stiffener ring for installing with the test head of a tester. A lower opening of the stiffener ring is installed with a lower printed circuit board for connecting to a probe head. Further, a plurality of coaxial transmitters are installed in the stiffener ring, and each of the coaxial transmitter comprises a plurality of coaxial cables with each of its two ends assembled with cable connectors, connecting to the upper and lower printed circuit boards respectively. The probe head is detachable and assembled with the lower printed circuit board. The probe head comprises a silicon substrate and a probe head carrier. It is preferable that a stress buffer layer is formed between the silicon substrate and the probe head carrier. The silicon substrate is installed on the stress buffer layer of the probe head carrier and has an exposed surface. The exposed surface is formed with a plurality of probe tips, and at least a flexible printed circuit board for connecting the silicon substrate is extending from the edges of the probe head carrier to electrically connect to the lower printed circuit board.

DETAIL DESCRIPTION OF THE INVENTION

Please refer to the drawings attached, the present invention will be described by means of an embodiment below.

Figure 1:
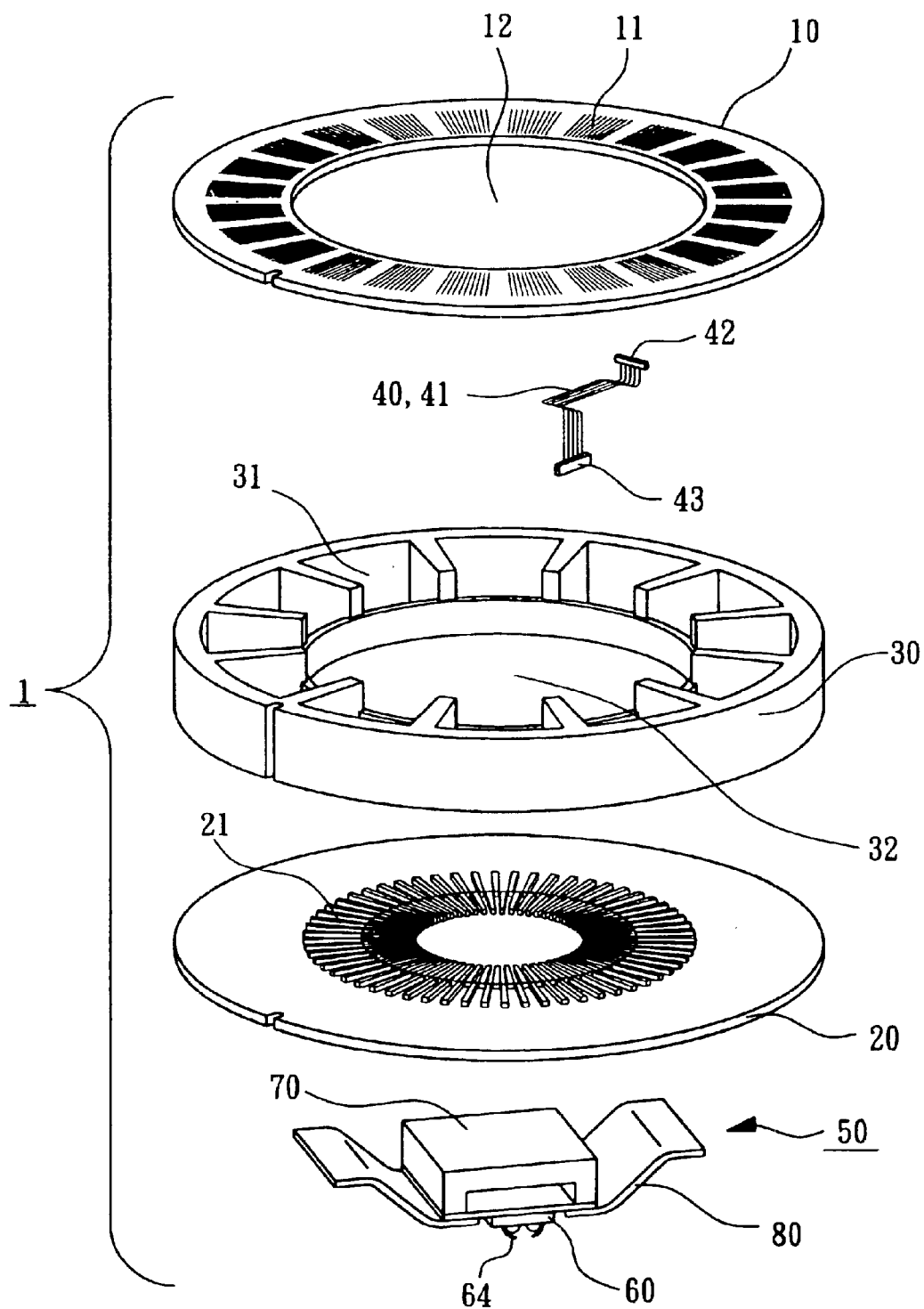
FIG. 1 is a decomposed three-dimensional view of a probe card assembly in accordance with the present invention.
Figure 2:
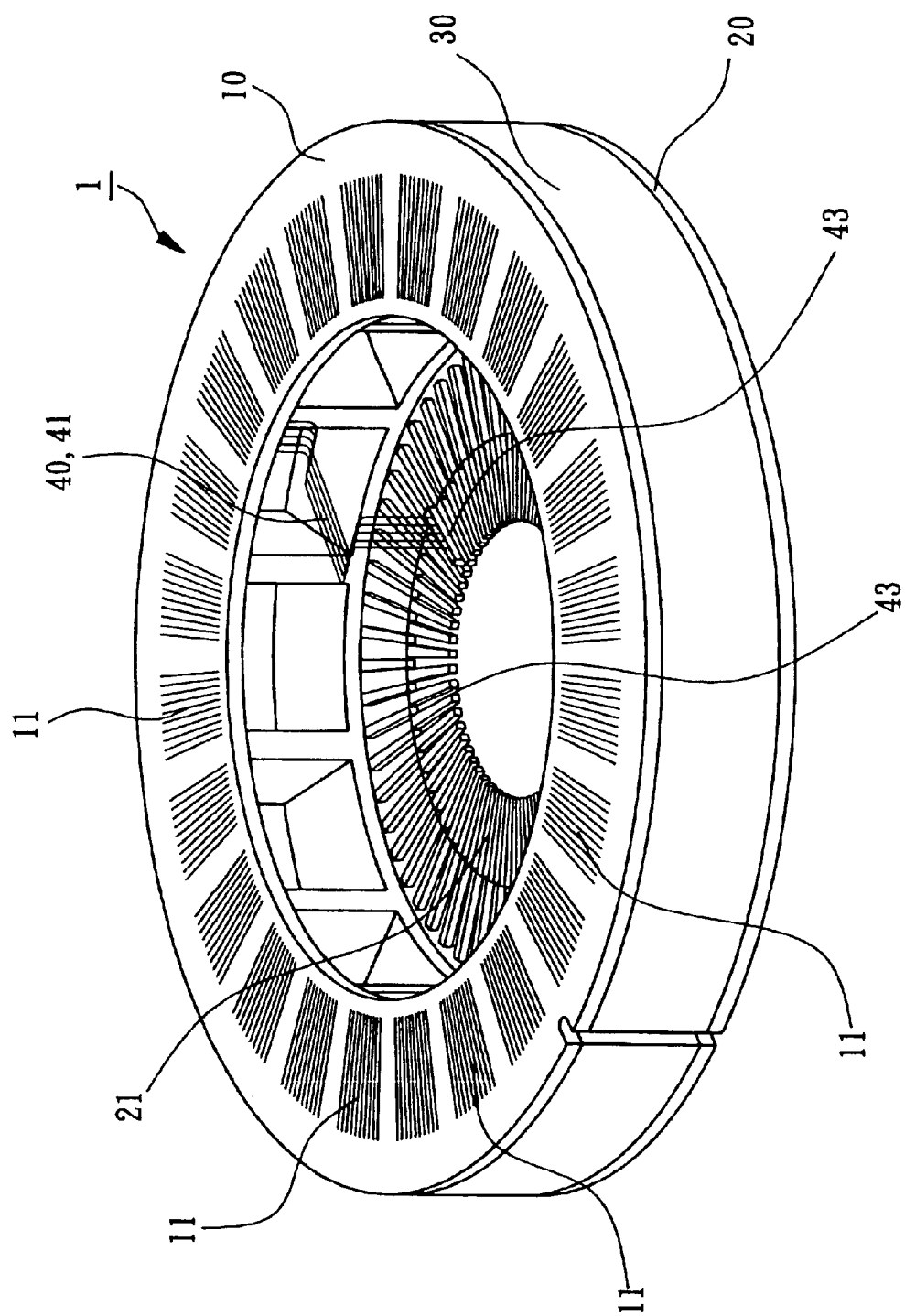
FIG. 2 is a three-dimensional view of a probe card assembly in accordance with the present invention.
Figure 3:
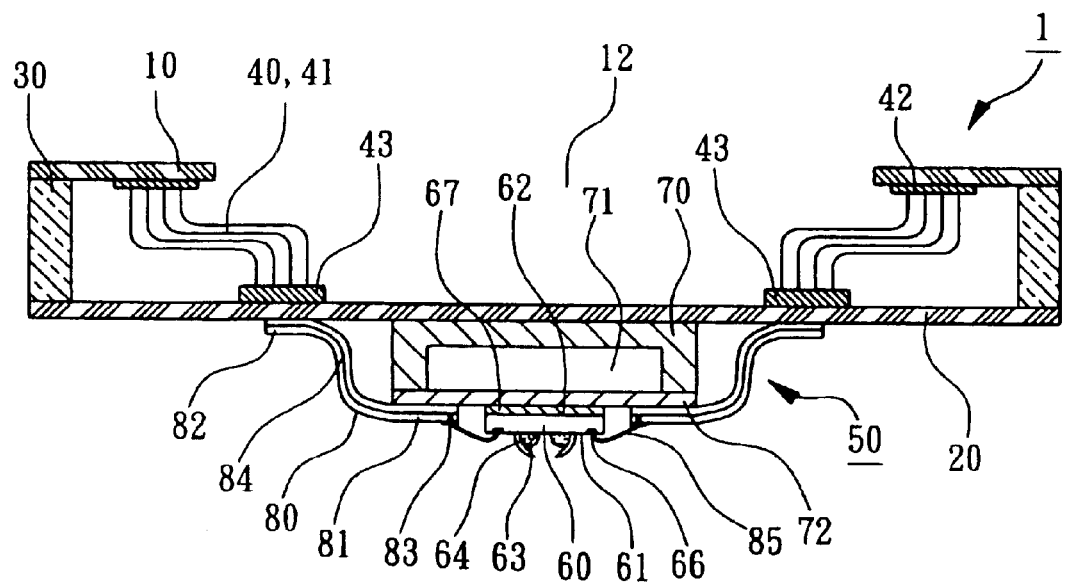
FIG. 3 is a cross-sectional view of a probe card assembly in accordance with the present invention.

The first embodiment according to the present invention is shown in FIGS. 1, 2, and 3. A probe card assembly 1 is provided to install on the test head of a tester. The probe card assembly is electrically connected to the tester for electrically contacting with the wafer under test, and allows the tester to perform chip probing or wafer sorting on the wafer. The probe card assembly 1 mainly comprises a stiffener ring 30, an upper printed circuit board 10, a lower printed circuit board 20, a modularized probe head 50, and a plurality of coaxial transmitters 40. Wherein the stiffener ring 30 is functioned as a spacer between the upper and lower printed circuit board 10,20, and to enclose the coaxial transmitters 40. The stiffener ring 30 has an upper opening 31 and a lower opening 32 with different size.

The upper printed circuit board 10 is installed on the upper opening 31 of the stiffener ring 30, and functions as a connecting interface between the tester and the probe card. On the outer surface of upper printed circuit board 10, contact pads 11 are formed. When probe card assembly 1 is connected to the test head of a tester, the contact pad 11 is electrically connected to the test head. The inner side of upper printed circuit board 10 is formed with a plurality of via holes, connectors, or sockets (not shown in figure), for connecting the cable connectors 42 of coaxial transmitters 40. It is preferable that a central opening 12 is formed on the center of printed circuit board 10. After the probe card assembly 1 being mounted onto a test head, the central opening 12 will be sealed, and when the probe card assembly 1 is dismounted, the coaxial transmitters 40 can be installed, adjusted or repaired via the central opening 12 of the upper printed circuit board 10 without disassembling the probe card assembly 1. The lower printed circuit board 20 is installed on the lower opening 32 of the stiffener ring 30 for assemble with the probe head 50. A plurality of sockets 21 are installed in the inner surface of the lower printed circuit board 20 to connect with the coaxial cable connectors 43 of coaxial transmitters 40 in plug-in and pull-away type. The coaxial transmitters 40 are installed between the upper printed circuit board 10 and the lower printed circuit board 20, and also in the stiffener ring 30. Each of the coaxial transmitters 40 comprises a plurality of coaxial cables 41. Two ends of each of the coaxial cable connect respectively to the cable connector 42 and 43 for connecting to the upper printed circuit board 10 and the lower printed circuit board 20 respectively. Furthermore, the inner side of the coaxial cable 41 is wrapped in metal cover to reduce electrical interference or high-frequency cross talk.

Figure 4:
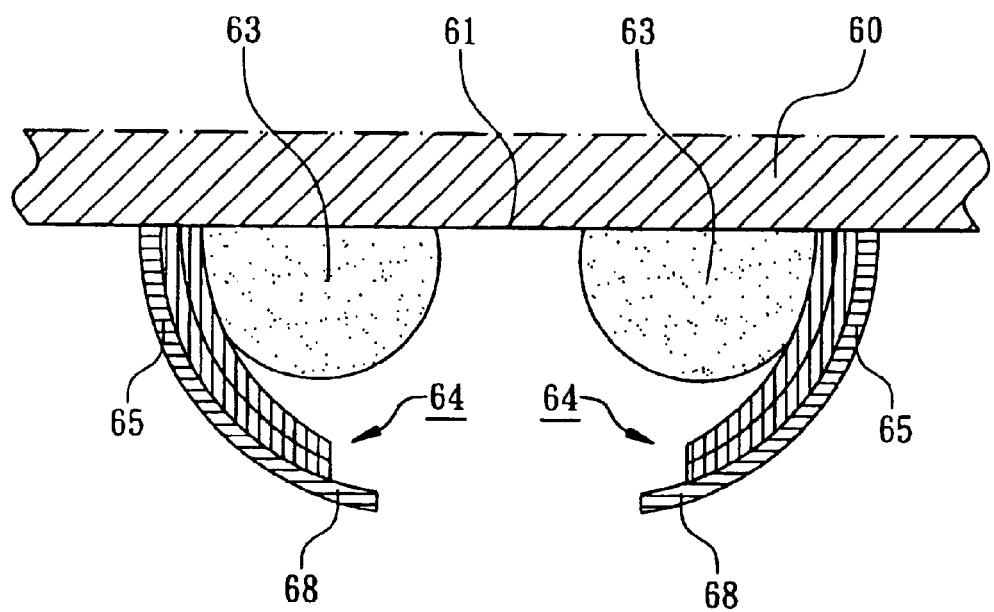
FIG. 4 is a cross-sectional view of a silicon substrate of the probe card assembly in accordance with the present invention.

As shown in FIGS. 1 and 3, a detachable probe head 50 is adhered, by means of conventional locking device, such as vacuum chuck, or screws, to the outer surface of lower printed circuit board 20. The probe head 50 comprises a silicon substrate 60 and a probe head carrier 70. The silicon substrate 60 has metal traces fabricated by IC process on it and is installed on the probe head carrier 70. The probe head carrier 70 is made by aluminum alloy or ceramic, and a downset 71 is manufactured at the center of the probe head carrier 70. The silicon substrate 60 is assembled with a stress buffer layer 72, such as polyimide film, which is flexible inside the downset 71 of the probe head carrier 70. Besides, the probe head carrier 70 has a flat surface to adhere to the lower printed circuit board 20. At least a flexible printed circuit board 80 attaches to and extends from the edges of the probe head carrier 70 to electrically connect to the lower printed circuit board 20. The flexible printed circuit board 80 has a circuit layer 84 which is electrically connected to the first end 81 and the second end 82. The first end 81 has a plurality of contact pads 83. The second end 82 can be installed with flexible printed circuit board (FPC) connectors (not shown in figure), for modularized electrical connection to the lower printed circuit board 20. As shown in FIG. 4, the silicon substrate 60 has an exposed surface 61 forming with circuits and a corresponding back surface 62. The back surface 62 is adhered to a stress buffer layer 72 with an adhesive 67. The exposed surface 61 is formed with a plurality of probe tips 64. In this embodiment, the probe tip 64 is curved cantilever probe, which comprising a high-hardness, low resistivity metal layer 65 with one end forming as a curved probing point 68 for probing the testing pads of wafers under test. One side of the probe tip 64 is supported by a stress-absorbing bump 63, such as nonconductive silicon gel or rubber, to achieve the elasticity of probes during chip probing and to avoid permanent deformation of probes. On the edges of exposed surface 61 of the silicon substrate 60, a plurality of bond pads 66 are formed which are electrically connected to the corresponding probe tip 64 through metal traces on the silicon substrate 60. By using wire bonding or inner lead bonding to electrically connect the bond pads 66 of silicon substrate 60 with the contact pads 83 of flexible printed circuit board 80. In this embodiment, a plurality of metal wires 85 formed by wire bonding are connected to the bond pads 66 of silicon substrate 60 and the contact pads 83 of flexible printed circuit board 80. Therefore, the structure mentioned above is a modularized flexible probe head 50, and the probe card assembly 1 can be disassembled as an upper printed circuit board 10, a lower printed circuit board 20, a probe head 50 and coaxial transmitters 40. It can be mass-produced, and then assembled with the stiffener ring 30 as a probe card assembly as required. For example, for wafers with same electrical function yet with different bonding pads patterned will only need to change the corresponding probe head 50. Further, for the probe heads 50 of different types of tester, it only needs to change the corresponding upper printed circuit board 10. For different chip probing or wafer sorting, it only needs to install and adjust the corresponding coaxial transmitters 40. Therefore, the probe card assembly 1 in this invention can replace the conventional multi-layer printed circuit boards and multi-layer ceramics substrates which are tailor-made to meet the special requirements for wafer under test. Furthermore, the probe card assembly according to the present invention is more practical, reusable, and standardized.

The above description of embodiments of this invention is intended to be illustrative and not limiting. Other embodiments of this invention will be obvious to those skilled in the art in view of the above disclosure.

What is claimed is:

1. A probe card assembly comprising:
   a lower printed circuit board; and
   a modularized probe head, which is detachable and assembled with the lower printed circuit board, the probe head comprising:
   a probe head carrier for installing on the lower printed circuit board, and having a stress buffer layer over a downset at the center;
   a silicon substrate having an exposed surface forming with a plurality of probe tips and contact points and a back surface, wherein the back surface is installed on a stress buffer layer of the probe head carrier; and the contact points are formed on edges of the exposed surface and are electrically connected to the probe tips;
   at least a flexible printed circuit board installing on the probe head carrier, the flexible printed circuit board having a first end electrically connecting to the contact points of the probe head and a second end extending away from the probe head carrier.

2. The probe card assembly according to claim 1, wherein each of the probe tips has a curved probing point.

3. The probe card assembly according to claim 1, wherein the exposed surface of silicon substrate is formed with a stress-absorbing bump for supporting the probe tips.

4. A probe card assembly comprising:

a stiffener ring having an upper opening and a lower opening;

an upper printed circuit board installing on the upper opening of the stiffener ring for electrically connecting to a test head of a tester;

a lower printed circuit board installing on the lower opening of the stiffener ring for connecting to a probe head;

a plurality of coaxial transmitters installing in the stiffener ring and between the upper and lower printed circuit boards, each of the coaxial transmitter comprising a plurality of coaxial cables, and two ends of each of the coaxial cable combining with cable connectors which connect respectively to the upper printed circuit board and the lower printed circuit board; and a modularized probe head with detachable function and assemble with the lower printed circuit board, and comprising a probe head carrier and a silicon substrate which is installed on the probe head carrier and having an exposed surface forming with a plurality of probe tips.

5. The probe card assembly according to claim 4, further comprising at least a flexible printed circuit board connecting to the silicon substrate and extending from the edges of the probe head carrier to electrically connect to the lower printed circuit board.

6. The probe card assembly according to claim 4, wherein the upper printed circuit board has a central opening for installing, adjusting, or fixing coaxial transmitters.

7. The probe card assembly according to claim 4, wherein each of the probe tips has a curved probing point.

8. The probe card assembly according to claim 4, wherein the exposed surface of silicon substrate is formed with a stress-absorbing bump for supporting the probe tips.

9. The probe card assembly according to claim 4, wherein the probe head carrier has a stress buffer layer made on the downset for bonding with the silicon substrate.

* * * * *